(12) United States Patent
    Chuang

(10) Patent No.: US 11,437,496 B2
(45) Date of Patent: Sep. 6, 2022

(54) UNIFORM IMPLANT REGIONS IN A SEMICONDUCTOR RIDGE OF A FINFET

(71) Applicant: TEXAS INSTRUMENTS INCORPORATED, Dallas, TX (US)

(72) Inventor: Ming-Yeh Chuang, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,647

(22) Filed: Dec. 30, 2020

(65) Prior Publication Data

US 2022/0123129 A1    Apr. 21, 2022

Related U.S. Application Data

(60) Provisional application No. 63/092,775, filed on Oct. 16, 2020.

(51) Int. Cl.
| | |
|---|---|
| *H01L 29/66* | (2006.01) |
| *H01L 21/265* | (2006.01) |
| *H01L 29/10* | (2006.01) |
| *H01L 29/78* | (2006.01) |

(52) U.S. Cl.
CPC .. *H01L 29/66803* (2013.01); *H01L 21/26586* (2013.01); *H01L 29/1095* (2013.01); *H01L 29/7856* (2013.01)

(58) Field of Classification Search
CPC .......... H01L 29/66803; H01L 29/7856; H01L 29/7851; H01L 29/41791; H01L 29/66795; H01L 29/785; H01L 29/06; H01L 21/823431; H01L 21/845; H01L 21/0415; H01L 21/0465; H01L 21/26586; H01L 27/0886
See application file for complete search history.

(56) References Cited

U.S. PATENT DOCUMENTS

| | | | | |
|---|---|---|---|---|
| 2013/0280876 | A1* | 10/2013 | Tsai | H01L 29/66803 438/283 |
| 2016/0315176 | A1* | 10/2016 | Sun | H01L 21/823431 |
| 2017/0345916 | A1* | 11/2017 | Hong | H01L 27/0886 |
| 2019/0006247 | A1* | 1/2019 | Chou | H01L 29/36 |
| 2020/0035815 | A1* | 1/2020 | Wu | H01L 29/7853 |
| 2022/0037487 | A1* | 2/2022 | Liao | H01L 29/42368 |

* cited by examiner

*Primary Examiner* — Joseph C. Nicely
(74) *Attorney, Agent, or Firm* — Andrew R. Ralston; Charles A. Brill; Frank D. Cimino

(57) ABSTRACT

A method for fabricating an integrated circuit is disclosed. The method comprises forming a semiconductor ridge over a semiconductor surface of a substrate and forming an implant screen on a top and sidewalls of the semiconductor ridge. The implant screen is at least two times thicker on the top of the semiconductor ridge relative to the sidewalls of the semiconductor ridge. The method further comprises implanting a dopant into the top and sidewalls of the semiconductor ridge.

16 Claims, 8 Drawing Sheets

UNIFORM IMPLANT REGIONS IN A SEMICONDUCTOR RIDGE OF A FINFET

TECHNICAL FIELD

This description relates to semiconductor devices. More particularly, but not exclusively, this description relates to methods and structures for providing substantially uniform implant regions in a semiconductor ridge, e.g. of a FinFET.

BACKGROUND

Field-effect transistors (FETs) can be formed in a variety of ways to serve a variety of purposes for integrated circuits and other devices. FETs are formed as "planar" devices in some integrated circuits, i.e., as devices in which the conduction channel has width and length extending in a direction parallel to the major surface of a substrate. FETs can be formed in a silicon-on-insulator (SOI) layer of a substrate or in a bulk silicon substrate.

FETs having a non-planar conduction channel may also be fabricated. In such non-planar FETs, either the length or the width of the transistor channel is oriented in the vertical direction, that is, in a direction perpendicular to the major surface of the substrate. These types of FETs have one or more channel ridges, or fins, formed between one or more trenches. In one such type of device, commonly referred to as the fin field-effect transistor (FinFET), the width of the conduction channel is oriented in the vertical direction, while the length of the channel is oriented parallel to the major surface of the substrate. With such orientation of the channel, FinFETs can be constructed to have a larger width conduction channel than planar FETs so as to produce larger current drive than planar FETs which occupy the same amount of integrated circuit area (the area parallel to the major surface of the substrate).

SUMMARY

In one example, a method for fabricating an integrated circuit is disclosed. The method comprises forming a semiconductor ridge over a semiconductor surface of a substrate and forming an implant screen on a top and sidewalls of the semiconductor ridge. The implant screen is at least two times thicker on the top of the semiconductor ridge relative to the sidewalls of the semiconductor ridge. The method further comprises implanting a dopant into the top and sidewalls of the semiconductor ridge.

In another example, a method for fabricating an integrated circuit including a fin field-effect transistor (FinFET) is disclosed. The method comprises forming a fin over a semiconductor substrate and forming an implant screen on the fin that is thicker at a top portion of the fin relative to the sidewalls of the fin. The method further comprises implanting a first dopant having a conductivity type that preferentially penetrates the implant screen over the sidewalls of the fin, and implanting a second dopant having the conductivity type that preferentially penetrates the implant screen over the top portion of the fin.

In yet another example, an integrated circuit is disclosed that comprises a semiconductor fin located over a substrate with the fin having doped region with a top surface and side surfaces, and a doped region of the fin including first and second dopants having a same conductivity type. The top surface of the fin has a greater concentration of the first dopant than the side surfaces, and the side surfaces has a greater concentration of the second dopant than the top surface.

DETAILED DESCRIPTION

Figure 1:
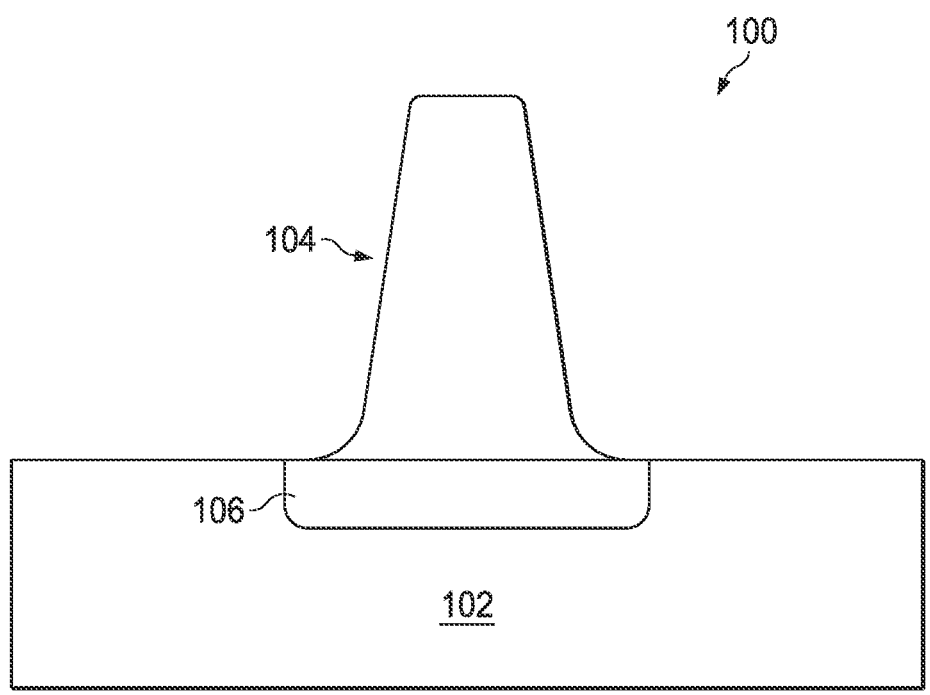
FIG. 1 illustrates a cross-sectional view of an example of a portion of FinFET device in its early stages of fabrication.

Certain field-effect transistors (FETs) have a non-planar conduction channel. In such non-planar FETs, either the length or the width of the transistor channel is oriented in the vertical direction, that is, in a direction perpendicular to the major surface of the substrate. These types of FETs have one or more semiconductor material ridges formed between one or more trenches. The semiconductor material ridges and trenches can be formed employing deep trench isolation, shallow trench isolation techniques, deposition and etching or other techniques. In one such type of device, commonly referred to as the fin field-effect transistor (FinFET), the width of the conduction channel is oriented in the vertical direction, while the length of the channel is oriented parallel to the major surface of the substrate. With such orientation of the channel, FinFETs can be constructed to have a larger width conduction channel than planar FETs so as to produce larger current drive than planar FETs which occupy the same amount of integrated circuit area (the area parallel to the major surface of the substrate).

In one example, the fin of the FinFET includes a body portion and an N-drift portion between the body portion and the drain of the device. A source is disposed on the opposite side of the body portion from the N-drift portion and the drain of the device. The N-drift portion facilitates an increase of breakdown voltage of the FinFET. Both the body portion and the N-drift portion are doped with doping implants to provide the necessary functionality of the transistor and the desired operational performance. In one example, the doping process utilizes rotational angle implants or plasma doping. In this situation, the implant screen dielectric (e.g., oxide) is formed, for example by growing or depositing uniformly on the top portion and sidewalls of the FinFET. During the implant rotations, regions at the top of the fin may receive more dopant than regions at the sidewalls of the fin due to the overlap of delivered dopants on the top of the fin over the rotational angle implants. The increased dopant in regions at the top of the fin relative to regions at the sidewalls of the fin may reduce the breakdown voltage of the FinFET.

Accordingly, at least some of the examples disclosed herein are directed towards forming an implant screen layer on the semiconductor material ridge with a greater thickness on top of the semiconductor material ridge relative to the sidewalls of the semiconductor material ridge. During the implant rotations, a fractional amount of dopant is implanted into the top region of the semiconductor material ridge by each implant rotation, such that a substantially uniform amount of dopant is implanted in regions in the sidewalls and top portion of the semiconductor material ridge.

For example, if the implant screen layer had a consistent thickness on the top portion and sidewalls of the semiconductor material ridge, then the dopant concentration, in one example, in the regions of the top portion of the semiconductor material ridge could be greater than or equal to 4× times the dopant concentration in the regions in the sidewalls of the semiconductor ridge. However, with the thickness of the implant screen layer being greater on the top portion of the ridge relative to the thickness on the sidewalls of the ridge, the dopant concentration in regions in the top portion of the semiconductor material ridge can be tuned by implanting a first dopant having a conductivity type that preferentially penetrates the implant screen over the sidewalls of the ridge, and implanting a second dopant having the conductivity type that preferentially penetrates the implant screen over the top portion of the ridge. The net effect of the two implant processes is a net dopant concentration that is substantially uniform along the top portion and sidewalls of the ridge with "substantially uniform" being understood to be ±50% of a mean dopant concentration at the surface of the ridge.

In one example, the implant screen layer is formed by one or more anisotropic oxide(s) formation processes and may include one or more isotropic oxide(s) formation processes. For example, the isotropic oxide process can grow oxide substantially uniformly on both the sidewalls and the top portion of the semiconductor material ridges, while the anisotropic deposition process can grow oxide on the top portion of the semiconductor material ridges substantially more than the sidewalls of the semiconductor material ridges. In this context, substantially uniform may be understood to mean having a thickness variation of no more than ±10%, and substantially more may be understood to mean at least about twice a thickness on the top portion than the sidewalls. The combination of anisotropic and isotropic deposition processes result in a thicker implant screen layer on the top of the semiconductor material ridges relative to the sidewalls of the semiconductor material ridges, which can be tuned to provide a substantially uniform dopant implant concentration throughout the top portion and sidewalls of the semiconductor material ridge. The isotropic oxide process can be executed prior to or after the anisotropic oxide process. In one example, the implant screen layer is formed by one or more anisotropic oxide(s) processes only.

The present examples in FIGS. 1-17 and accompanying discussions will be illustrated with respect of implant dopant of an n-drift region of a fin of a FinFET. However, the described technique of employing an implant screen layer and rotational implant process can be employed to produce a substantially uniform dopant in the other regions of the FinFET, e.g. source regions, drain regions and body regions. Additionally, the implant screen layer and rotational implant techniques can be employed in any device besides a FinFET that requires regions with substantially uniform dopant concentration in one or more portions of a semiconductor material ridge.

FIGS. 1-17 illustrate a sequence of fabrication processes for forming a FinFET device. FIG. 1 illustrates a cross-sectional view of an example of a portion of FinFET device 100 in its early stages of fabrication. Though depicted sequentially as a matter of convenience, at least some of the actions shown can be performed in a different order and/or performed in parallel. Additionally, some implementations may perform only some of the actions shown. The FinFET device of FIG. 1 includes a generally trapezoidal semiconductor fin structure 104 overlying a substrate 102. The substrate 102 may be bulk silicon, silicon on insulator (SOI), silicon-germanium, gallium arsenide, etc. In one example, a reduced surface field (RESURF) layer is formed on the oxide layer of an SOI substrate. In another example, an n-type layer is formed in a bulk silicon substrate and a RESURF layer is formed on the n-type layer. The fin 104 may be formed by etching the substrate 100 to create a fin 104 of the substrate material.

In some implementations, an epitaxial layer (e.g., monocrystalline silicon) is grown on the substrate after buried and/or well layers are formed, and the epitaxial layer is etched to form a fin. While a single fin is referenced herein as a matter of clarity, in practice, any number of fins may be formed. In the example, of FIG. 1 the base of the fin 104 is formed on a substrate 102 and a RESURF layer 106 is disposed below the fin 104. Additional buried and/or well structures can be formed. For example, impurities may be added to the silicon of the fin 104 to adjust the threshold voltage or other parameters of the FinFET. In some implementations, an n-type drift layer may be formed on a portion of the fin 104 to improve drain breakdown voltage in the FinFET.

Figure 2:
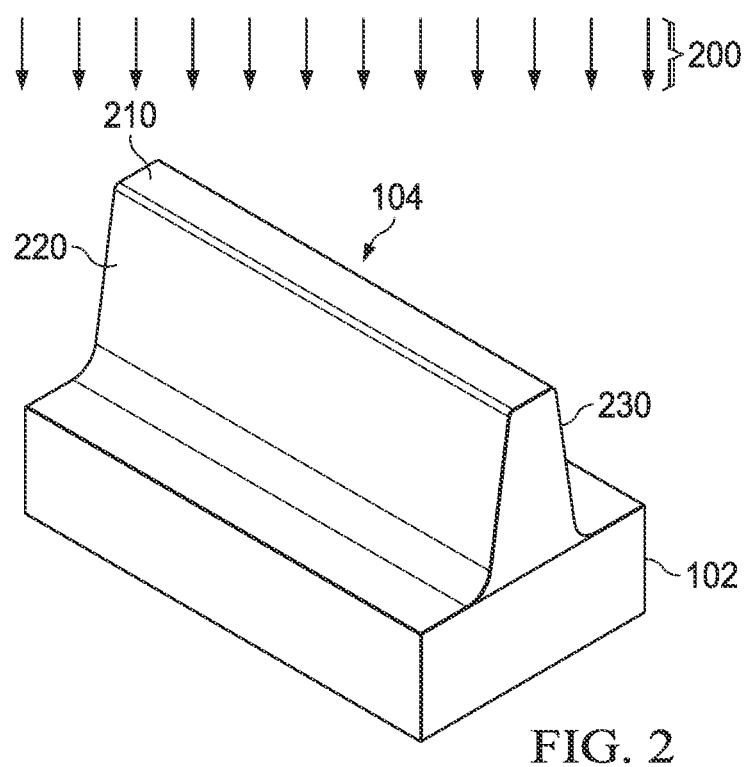
FIG. 2 is a perspective view of the fin of FIG. 1 undergoing a dielectric formation process to form an implant screen layer.
Figure 3:
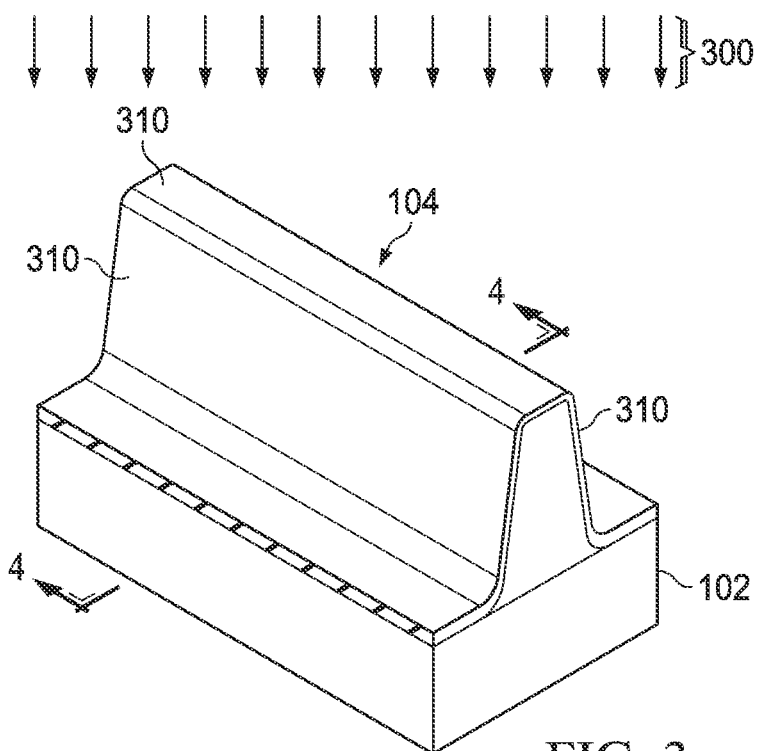
FIG. 3 is a perspective view of the fin of FIG. 2 undergoing a subsequent dielectric formation process to form a second implant screen layer.

FIG. 2 is a perspective view of the fin 104 of FIG. 1 undergoing a dielectric formation process 200 to form an implant screen layer (e.g., implant screen dielectric layer) over a top portion 210 of the fin 104 and sidewalls 220 and 230 of the fin 104. Any suitable technique for forming the implant screen layer may be employed such as thermal oxidation, Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques. The dielectric formation process 200 can be an isotropic process that deposits or grows dielectric substantially similarly in both the sidewalls 220 and 230 and the top portion 210 of the fin 104. The resultant structure is illustrated in FIG. 3 with an implant screen layer 310 with a substantially uniform thickness on both the sidewalls 220 and 230 and the top portion 210 of the fin 104. In the illustrated example the implant screen layer 310 is a conformal layer covering the top 210 and sidewalls 220, 230.

Figure 4:
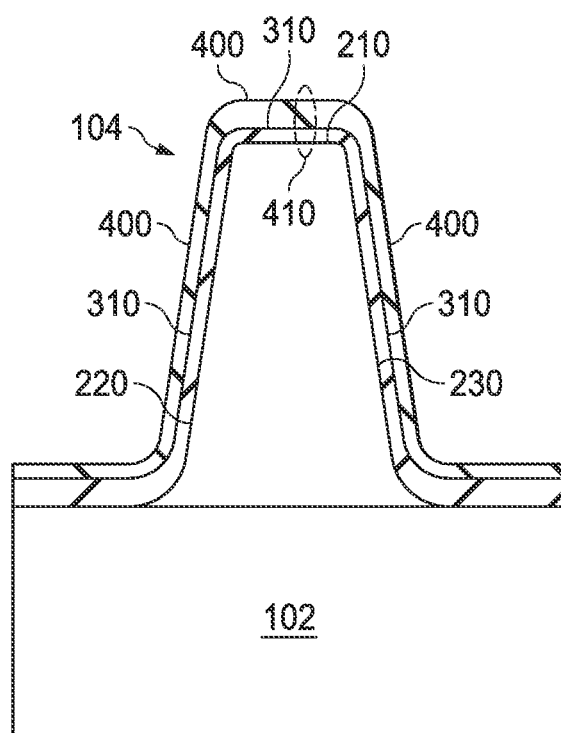
FIG. 4 illustrates a cross-sectional view of the fin of FIG. 3 after the subsequent dielectric formation process to form the second implant screen layer.

FIG. 3 is a perspective view of the fin 104 of FIG. 2 undergoing a subsequent dielectric formation process 300 to form a second implant screen layer 400 (e.g., implant screen layer) (FIG. 4) that is thicker over the top portion 210 of the fin 104 than the sidewalls 220 and 230 of the fin 104. The Any suitable technique for forming the subsequent implant screen layer 400 may be employed such as thermal oxidation, LPCVD, PECVD, HDPCVD, sputtering or spin-on techniques. The subsequent dielectric formation process 300 is an anisotropic process that deposits or grows dielectric substantially more on the top portion 210 of the fin 104 relative to the sidewalls 220 and 230 of the fin 104. The resultant structure is illustrated in FIG. 4. In the illustrated example the implant screen layer 400 is a conformal layer covering the top 210 and sidewalls 220, 230.

Figure 5:
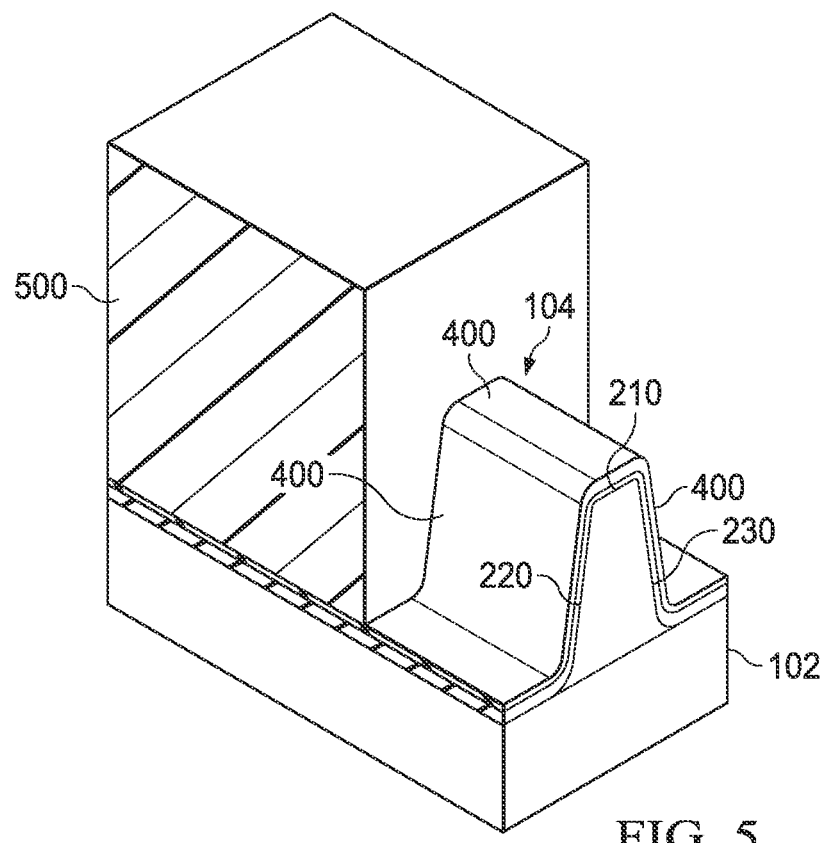
FIG. 5 illustrates a perspective view of the fin of FIG. 4 after deposition, patterning and developing of a photoresist material layer over the fin.

FIG. 4 illustrates a cross-sectional view of the fin of FIG. 3 after the subsequent dielectric deposition process to form the second implant screen layer 400 that is thicker over the top portion 210 of the fin 104 relative to the sidewalls 220 and 230 of the fin 104. In one example, the combined thickness of the first and second implant screen layers 310 and 400 form an implant screen 410 that is thicker at the top portion 210 of the fin 104 relative to the sidewalls 220 and 230. For example, the implant screen 410 has a thickness of about 30 nm to about 50 nm (e.g., 40 nm) at the top portion 210 of the fin 104, while the thickness of the implant screen 410 on the sidewalls 220 and 230 of the fin 104 is about 5 nm to about 15 nm (e.g., 10 nm). Thus, the implant screen 410 may have a thickness at the top portion 210 that is between about two times and ten times a thickness on the sidewalls 220 and 230. In various examples the implant screen 410 may be or include an oxide of a semiconducting material, e.g. silicon oxide, or may be or include a nitride of a semiconducting material, e.g. silicon nitride. FIG. 5 illustrates a perspective view of the fin 104 of FIG. 4 after deposition, patterning and developing of a photoresist layer 500 over the fin 104, such that only a selected targeted region of the fin 104 is exposed for implanting dopant.

Figure 6:
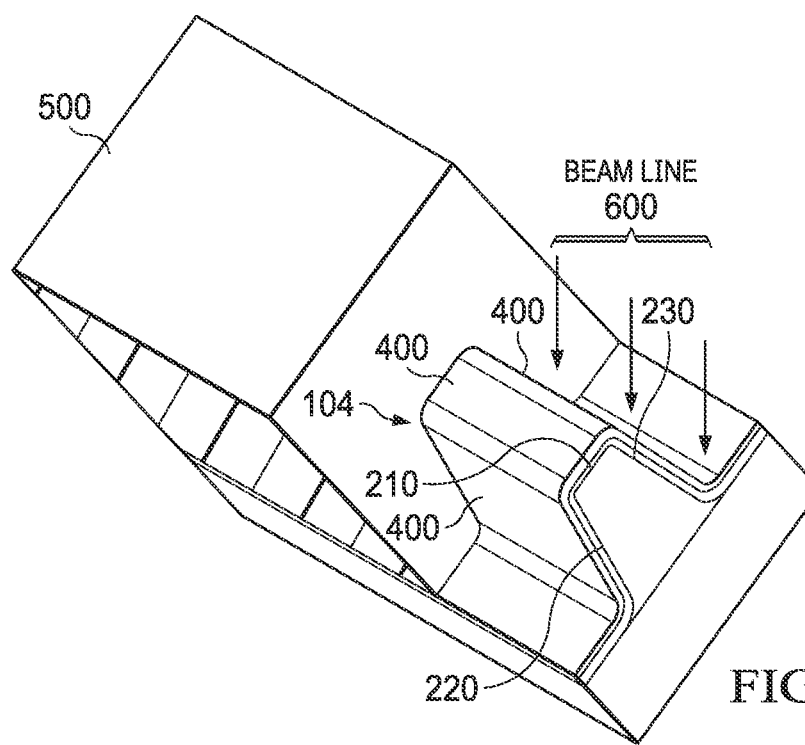
FIG. 6 illustrates a perspective view of the fin of FIG. 5 undergoing a first dopant implant process where a beam line provides dopant on the sidewall and the top portion of the fin at a first angle.
Figure 7:
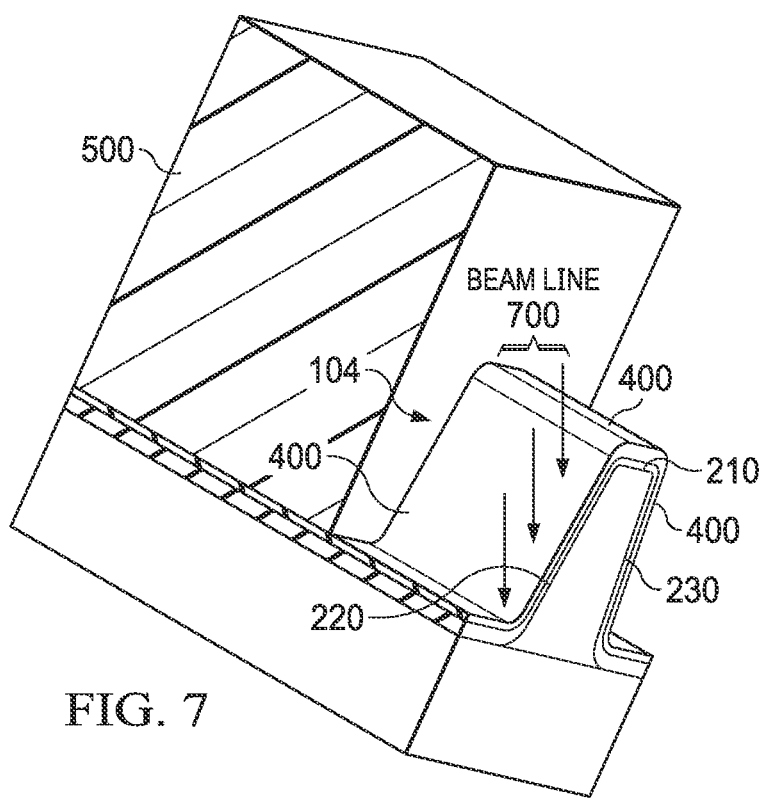
FIG. 7 illustrates a perspective view of the fin of FIG. 6 undergoing a second dopant implant process where a beam line provides dopant on the first sidewall opposite the second sidewall, and the top portion of the fin at a second angle.
Figure 8:
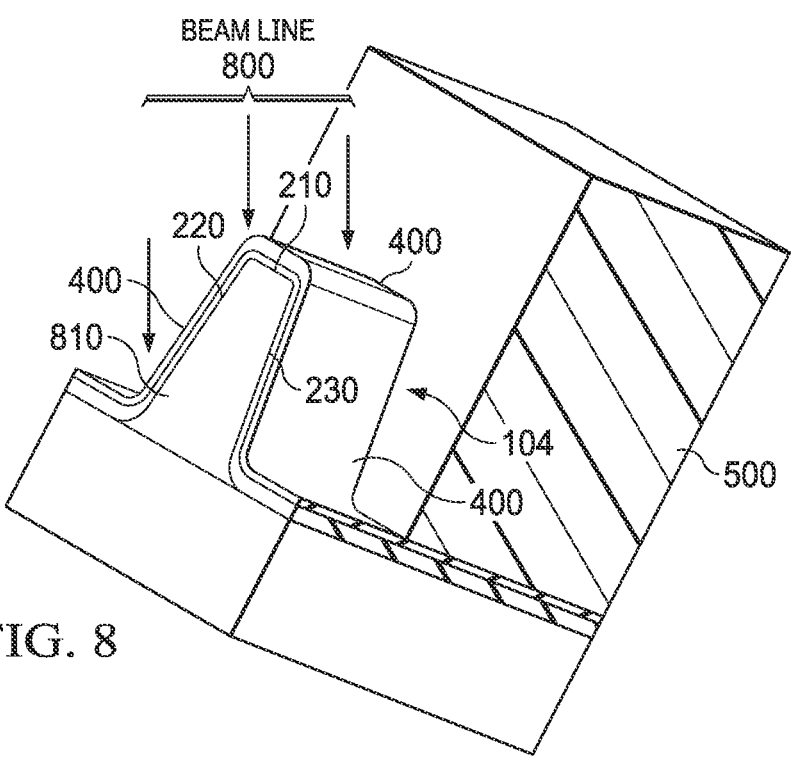
FIG. 8 illustrates a perspective view of the fin of FIG. 7 undergoing a third dopant implant process where a beam line provides dopant along a longitudinal axis of the fin on the front of its face, and the top portion of the fin at a third rotational angle.

FIG. 6 illustrates a perspective view of the fin of FIG. 5 undergoing a first dopant implant process where a beam line 600 of an ion implantation process provides dopant on the sidewall 230 and the top portion 210 of the fin 104 at a first angle. The fin 104 is then rotated for a subsequent dopant implant process. FIG. 7 illustrates a perspective view of the fin 104 of FIG. 6 undergoing a second dopant implant process where a beam line 700 provides dopant on the first sidewall 220 opposite the second sidewall 230, and the top portion 210 of the fin 104 at a second angle. The fin 104 is then rotated for yet another subsequent dopant implant process. FIG. 8 illustrates a perspective view of the fin 104 of FIG. 7 undergoing a third dopant implant process where a beam line 800 provides dopant along a longitudinal axis of the fin 104 on the front of its face 810, and the top portion 210 of the fin 104 at a third angle.

Although three dopant implant angles are shown in the present example, any number of rotational dopant implants can be performed based on a particular application and a desired dopant concentration in the selected region of the fin 104. For example, a fourth dopant implant process may be performed in which the fin 104 is rotated 180° relative to the view of FIG. 8 such that the implant beam line is directed toward the top portion 210 at about an equal but opposite angle as that shown in FIG. 8. A sequence of implants at different angles relative to the beam line may be referred to herein as a rotational implant process. As understood by those skilled in the semiconductor arts, such angles may be implemented by rotation (twist) and tilt of a platen that supports the substrate 102 during implant processing. The implant process described by FIGS. 6-8, and the described fourth dopant implant process, may be referred to as a 4-rotation implant. In other examples a plasma doping process may be used, with the implant angles being relative to a mean dopant flux.

As can be seen from FIGS. 6-8, the top portion 210 of the fin 104 has overlapping doping regions from the dopant implants at the different rotational angles, while each sidewall 220 and 230 only receives dopant at a single rotation angle. However, due to the thicker implant screen at the top portion 210 of the fin 104 relative to the sidewalls 220 and 230, the dopant concentration throughout the fin 104 from the dopant implants at the different rotational angles is relatively uniform. The photoresist layer 500, the first and second implant screen layers 310 and 400 are then removed to provide the resultant structure 900 of FIG. 9.

Figure 9:
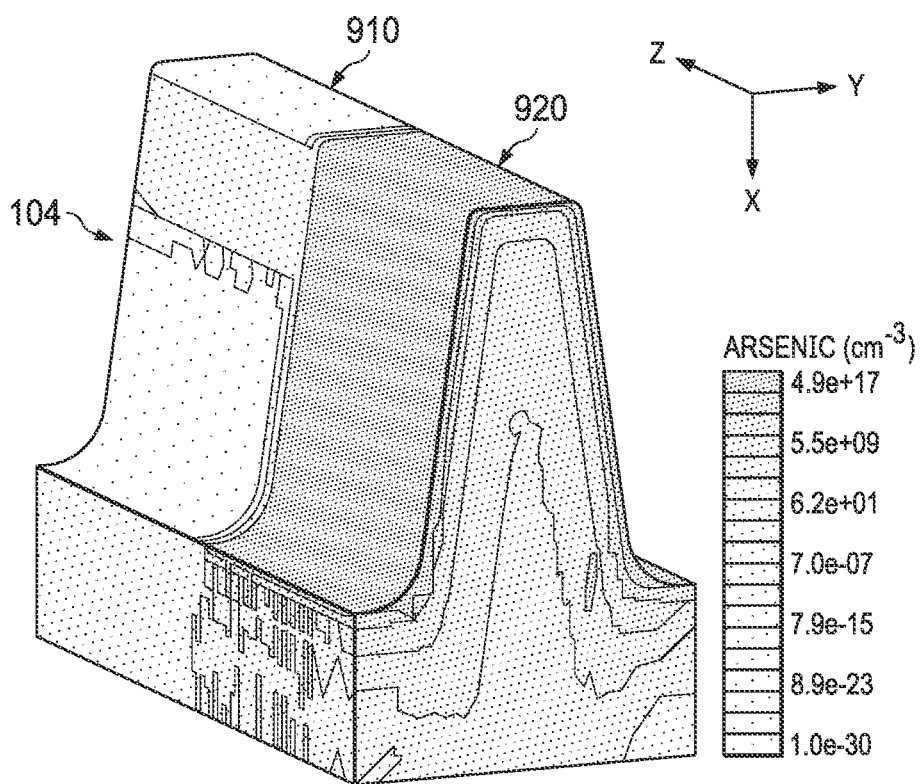
FIG. 9 illustrates a perspective view of the fin of FIG. 8 after removal of the photoresist layer, and the first and second implant screen layers with a legend showing dopant concentrations in different regions of the face of the fin across the cross-section of the fin.

FIG. 9 illustrates a perspective view of the fin of FIG. 8 after removal of the photoresist layer, and the first and second implant screen layers with a legend showing concentrations of arsenic as a first n-type dopant in different regions of face of the fin across the cross-section of the fin 104, according to one example. The illustrated dopant distribution may result from a 4-rotation implant process. The implant energy may be selected such that the arsenic penetrates the implant screening layers 310 and 400 to a greater extend along the sidewalls 220 and 230. This result is expected due to the thicker screening material at the top of the fin 104, and the relatively large size of the arsenic ion. A particular implant energy that results in this different penetration is expected to vary depending on the particular characteristics of the implant screening layers 310 and 400, and may be determined by those skilled in the art.

A second dopant having a smaller ion size, e.g. phosphorous, may be implanted by a second 4-rotation implant process. The second dopant may preferentially penetrate the implant screening layer 310 and 400 along the top of the fin 104, in spite of the greater thickness of the screening layer 400 along the top of the fin 104, due to the angle of the angle of the implant beam and the smaller ion size. Again, a particular implant energy of the second dopant that results in this different penetration is expected to vary depending on the particular characteristics of the implant screening layers 310 and 400, and may be determined by those skilled in the art. An analogous legend of concentrations for phosphorous would show similar gradients, but with a greater concentration of phosphorous on the top portion than the sides of the fin. The net effect of the two implant processes is a net dopant concentration that is substantially uniform along the top 210 and sides 220, 230. In this context "substantially uniform" is understood to be ±50% of a mean dopant concentration at the surface of the fin 104. While the example is presented using first conductivity type, e.g. n-type, dopants phosphorous and arsenic, doping may be similarly implemented using dopants having a second conductivity type, e.g. p-type dopants such as boron and gallium.

Figure 10:
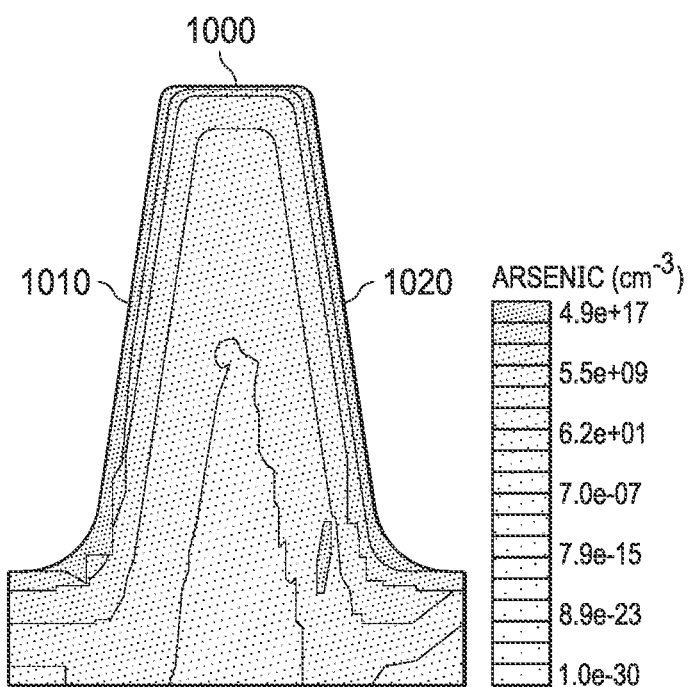
FIG. 10 illustrates a cross-sectional view of the face of the fin with a legend showing dopant concentrations in different regions of the cross-section of the fin.

The fin 104 includes a mask region 910 that did not receive any dopant implant where the photoresist layer 500 protected the fin 104 from the sequence of implants, and an implant region 920 where the dopant was implanted. FIG. 10 illustrates a cross-sectional view of the face of the fin with a legend showing dopant concentrations in different regions of the cross-section of the fin. As shown in both FIG. 9 and FIG. 10, the dopant concentration in a first sidewall region 1010, a second sidewall region 1020 and a top portion region 1000 of the fin have substantially uniform dopant concentrations with respect to one another.

Although FIGS. 3-10 illustrate the formation of substantially uniform dopant concentrations in regions in the top portions and sidewalls for a single region of a fin, the processes can be employed to selectively dope different regions of the fin by employing photoresist material over the non-selected regions and performing a sequence of different rotational dopant implants at a selected region for a plurality of selected regions. For example, selected regions to be doped can include a drain region, a body region, an N-drift region and a source region of a FinFET. The implant screen can remain over the entire fin throughout each doping region and be removed once the final doped region has been implanted. In this manner, each doped region can have a substantial uniform implant concentration in both the regions in the top portion 210 and the regions in the sidewalls 220 and 230 of the fin 104.

Figure 11:
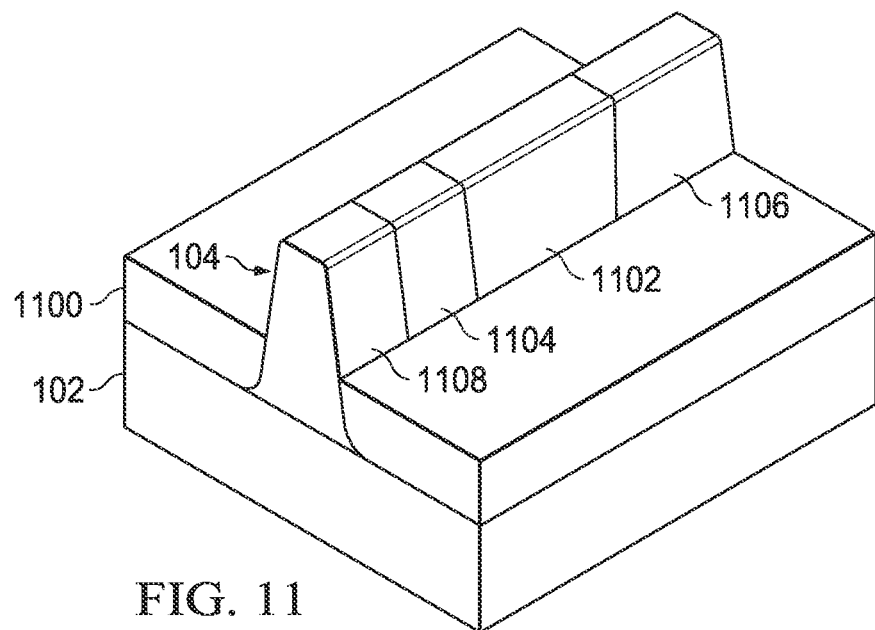
FIG. 11 illustrates a perspective view of the fin of FIG. 9 and FIG. 10 with a shallow trench isolation applied to the substrate, and the fin divided into a source region, a body region, an N-drift region and a drain region.

FIG. 11 illustrates a perspective view of the fin 104 of FIG. 10 after each transistor region has been doped and after deposition of a shallow trench isolation (STI) dielectric layer 1100 formed on the substrate 102 about the fin 104. The STI dielectric layer 1100 formation includes depositing a dielectric material, such as silicon dioxide, on the substrate 102 to fill a space about the fin 104, and etching the dielectric material to a desired thickness, thereby exposing a desired height of the fin 104. FIG. 11 shows the fin separated into different transistor regions. The different transistor regions include a source region 1108, a body region 1104, a drift region 1102 and a drain region 1106. The drift region 1102 is adjacent the drain region 1106 and the body region 1104. The body region 1104 is adjacent the source region 1108 and the drift region 1102.

A dielectric layer 1202 is formed on the fin 104 and the STI dielectric layer 1100 of FIG. 11. The dielectric layer 1202 may be silicon dioxide and have a thickness of about 30 nm to about 120 nm in some implementations. In some implementations, a layer of tetra-ethoxysilane (TEOS) 1204 may be deposited over the dielectric layer 1202. Next, a layer of photoresist 1206 is applied over the dielectric layer 1202. The photoresist layer 1206 patterns the dielectric layer 1202 for creation of a field plating oxide on the drift region 1102 of the fin 104. The dielectric layer 1202 is etched to create field plating oxide (a field plating oxide layer) on the drift region 1102 of the fin 104. For example, the dielectric layer 1202 is removed from all surfaces of the fin 104 except surfaces of the drift region 1102 subsequent to etching. Wet etching may be applied to remove the dielectric layer 1202.

Figure 12:
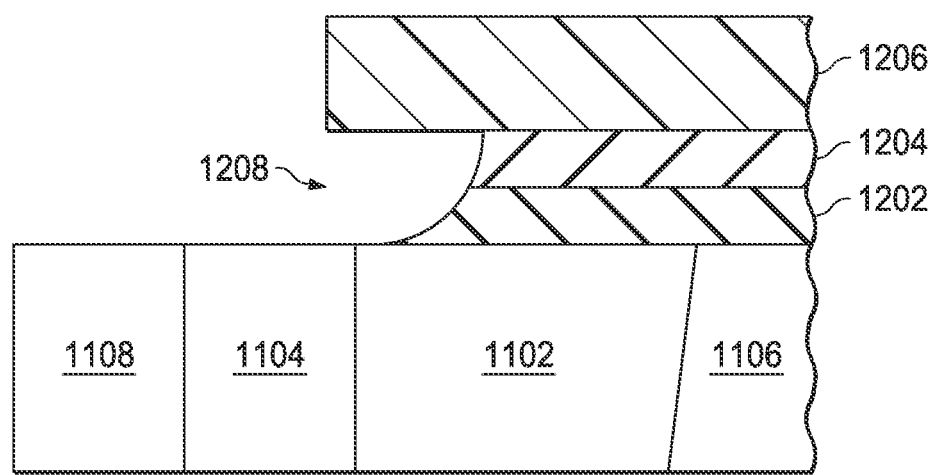
FIG. 12 illustrates a cross-sectional view of the fin of FIG. 11 with a dielectric layer, a tetra-ethoxysilane layer, and a photoresist layer.
Figure 13:
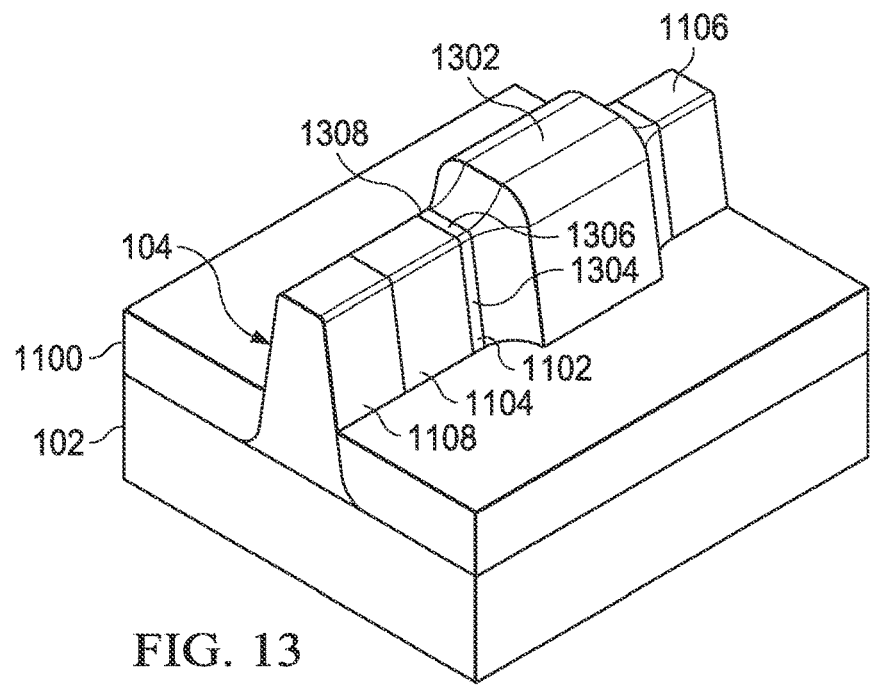
FIG. 13 illustrates a perspective view of the fin of FIG. 12 with field plating formed on a drift region of the fin.

FIG. 12 shows a cross-sectional view of the dielectric layer 1202, the TEOS layer 1204, and the photoresist layer 1206 on the fin 104 after etching and before removal of the photoresist layer 1206. An undercut 1208 produced by the etching creates a smooth corner that increases breakdown voltage, relative to a sharp corner (e.g., 90°) that increases electric field and decreases breakdown voltage. FIG. 13 shows a perspective view of the FinFET with a field plating dielectric 1302 (field plating oxide layer) formed on the drift region 1102 of the fin 104. The field plating dielectric 1302 is formed on three sides (side 1304, side 1306, and side 1308) of the drift region 1102. Side 1308 is opposite side 1304.

Figure 14:
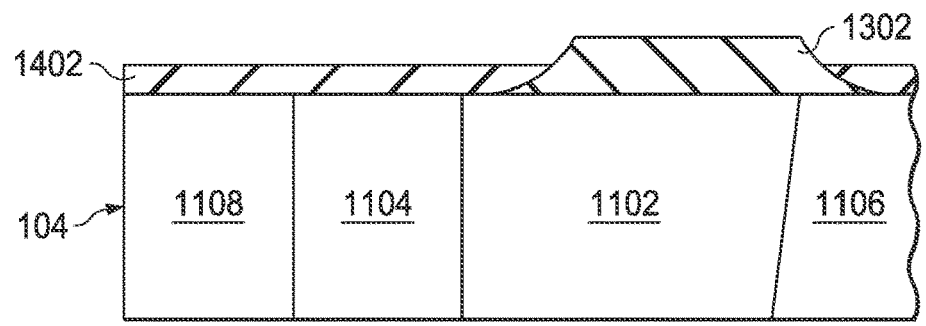
FIG. 14 illustrates a cross-sectional view of the fin of FIG. 13 with a gate dielectric and the field plating over the fin.
Figure 15:
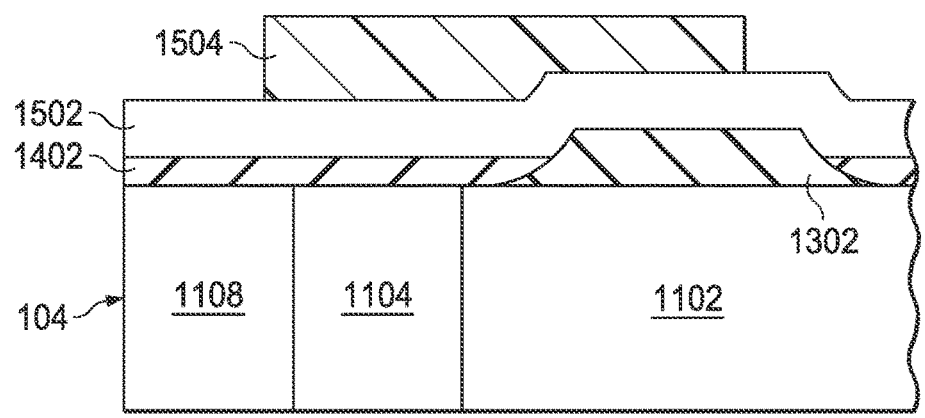
FIG. 15 illustrates a cross-sectional view of the fin of FIG. 14 with a photoresist layer overlying a portion of the gate dielectric and the field plating over the fin.

Next, a layer of dielectric material (a gate dielectric layer 1402) is formed on the fin 104. This layer of dielectric material may be silicon dioxide. FIG. 14 shows a cross-sectional view of the gate dielectric layer 1402 and the field plating dielectric 1302 formed on the fin 104. The gate dielectric layer 1402 is adjacent to and engages the field plating dielectric 1302. As shown in FIG. 15, a conductive layer 1502, such as polysilicon, is deposited on the gate dielectric layer 1402 of the fin 104, and on at least a portion of the field plating dielectric 1302 of the fin 104. A layer of photoresist 1504 is applied over the conductive layer 1502. The photoresist layer 1504 patterns the conductive layer 1502 for creation of a gate region on the body region 1104 and a field plate on a portion of the drift region 1102 of the fin 104. FIG. 15 shows a cross-sectional view of the conductive layer 1502 and the photoresist layer 1504 applied to the fin 104.

Figure 16:
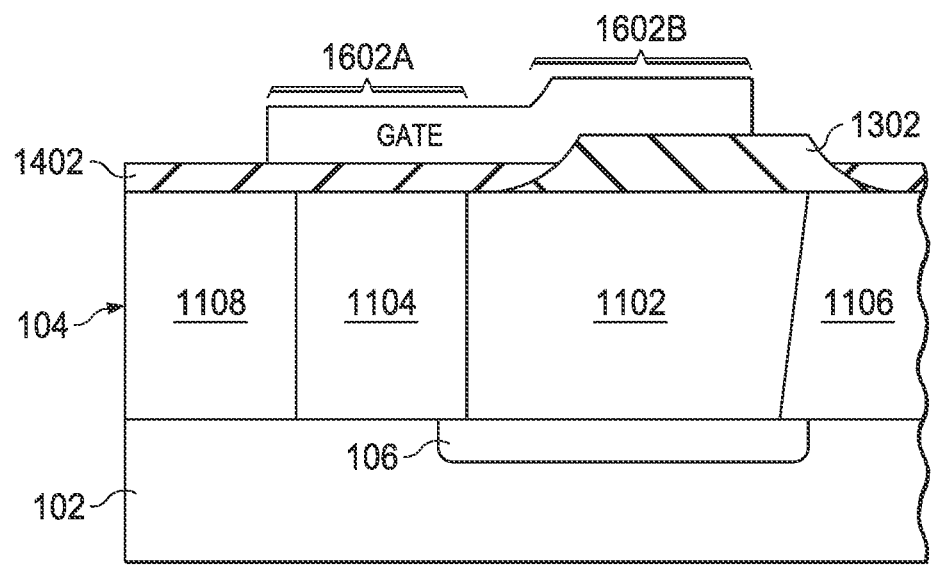
FIG. 16 illustrates a cross-sectional view of the fin of FIG. 15 with a gate region formed over a portion of the gate dielectric and the field plating over the fin.
Figure 17:
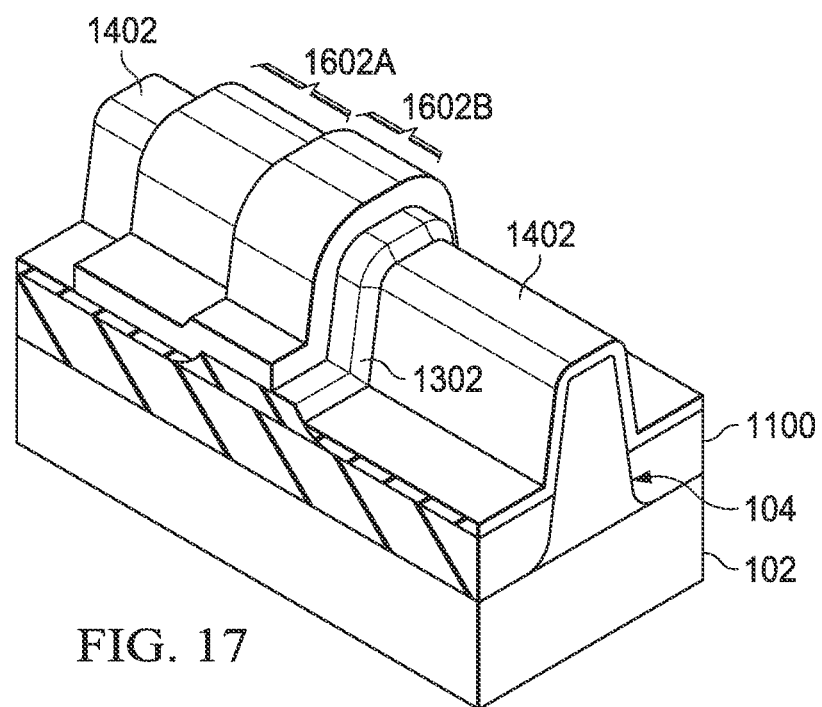
FIG. 17 shows a perspective view of the fin of FIG. 16 with a gate region formed on three sides of the fin.

An etch process is performed on the structure of FIG. 15 on the conductive layer 1502 to form a gate region on the body region 1104 and a field plate on a portion of the drift region 1102 of the fin 104. FIG. 16 shows a cross-sectional view of a gate electrode 1602A formed on the body region 1104 and a field plate 1602B on a portion of the drift region 1102 of the fin 104 by etching the conductive layer 1502. FIG. 17 shows a perspective view of the gate electrode 1602A and the field plate 1602B formed on the fin 104. Although not shown, back end of line (BEOL) processing can be performed of the structure of FIG. 17. For example, metal terminals and/or routing traces are added to the source region 1108, the drain region 1106, and the gate electrode 1602A to provide a gate contact (not shown) on the gate electrode 1602A, a drain contact (not shown) on the drain region 1106 and a source contact (not shown) on the source region 1108.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method for fabricating an integrated circuit, the method comprising:

forming a semiconductor ridge over a semiconductor surface of a substrate;

forming an implant screen on a top and sidewalls of the semiconductor ridge, the implant screen being at least two times thicker on the top of the semiconductor ridge relative to the sidewalls of the semiconductor ridge; and implanting a dopant into the top and sidewalls of the semiconductor ridge.

2. The method of claim 1, wherein implanting the dopant includes implanting a first dopant having a conductivity type and a first ion size, and implanting a second dopant having the same conductivity type and a second ion size.

3. The method of claim 2, wherein the first dopant is phosphorus and the second dopant is arsenic.

4. The method of claim 2, wherein a net concentration of dopant having the conductivity type varies by no more than ±50% between the top of the fin and the sidewalls of the fin.

5. The method of claim 1, wherein implanting the dopant includes implanting dopants with a direction aligned with a longitudinal axis of the semiconductor ridge.

6. The method of claim 1, wherein the semiconductor ridge is a fin of a fin field-effect transistor (FinFET).

7. The method of claim 6, wherein the dopant is implanted into an N-drift portion of the FinFET.

8. The method of claim 1, wherein the forming an implant screen on the top and sidewalls of the semiconductor ridge comprises performing an anisotropic dielectric thermal oxidation or deposition process.

9. The method of claim 8, wherein the forming an implant screen on the top and sidewalls of the semiconductor ridge further comprises performing an isotropic dielectric thermal oxidation or deposition process.

10. The method of claim 1, further comprising:

forming a dielectric layer over the semiconductor surface, the dielectric layer covering a lower portion of the sidewalls and exposing the top of the semiconductor ridge.

11. A method for fabricating an integrated circuit including a fin field-effect transistor (FinFET), the method comprising:

forming a fin over a semiconductor substrate;

forming an implant screen on the fin that is thicker at a top portion of the fin relative to the sidewalls of the fin;

implanting a first dopant having a conductivity type that preferentially penetrates the implant screen over the sidewalls of the fin; and implanting a second dopant having the conductivity type that preferentially penetrates the implant screen over the top portion of the fin.

12. The method of claim 11, wherein the first and second dopants are implanted into a drift portion of the FinFET.

13. The method of claim 11, wherein forming the implant screen includes performing an isotropic dielectric thermal oxidation or deposition process and performing an anisotropic dielectric thermal oxidation or deposition process.

14. The method of claim 11, further comprising:

removing the implant screen;

forming an oxide layer over a body region and a drift region of the semiconductor ridge;

forming a polysilicon gate electrode over the body region and a field plate over the drift region.

15. The method of claim 14, wherein the drift region is an N-type drift region.

16. The method of claim 11, wherein the first dopant is arsenic and the second dopant is phosphorous.

* * * * *